Oct. 25, 1966 R. K. JONES 3,281,762

COMPOSITE TERMINAL BOARD WITH SLIDABLE TERMINALS

Filed Jan. 6, 1964 2 Sheets-Sheet 1

RAY K. JONES
INVENTOR by John B. Sponsler

Oct. 25, 1966 R. K. JONES 3,281,762

COMPOSITE TERMINAL BOARD WITH SLIDABLE TERMINALS

Filed Jan. 6, 1964 2 Sheets-Sheet 2

3,281,762

COMPOSITE TERMINAL BOARD WITH SLIDABLE TERMINALS

Ray K. Jones, Roanoke, Va., assignor to General Electric Company, a corporation of New York Filed Jan. 6, 1964, Ser. No. 335,822
4 Claims. (Cl. 339—198)

This invention relates to electrical terminal blocks and terminal boards composed of interlocking terminal blocks.

More particularly, the invention is directed to a composite terminal board for mounting electrical components of varying sizes and lengths whereby easy installation and replacement are effected without disrupting other electrical components adjacent thereto.

In the manufacture and production of electrical apparatus various electrical components are utilized of different sizes, lengths, et cetera. Normally the design of the apparatus includes fixed terminal facilities for attaching such components, and in some instances the components may be incorporated into the apparatus via printed circuit boards and the like. In the higher capacity electrical apparatus, however, it is frequently necessary to mount electrical components upon so called terminal boards so that changes of components can be made after the apparatus is in service without replacing the entire circuit board. Frequently also, and particularly in complex electrical control apparatus, it is necessary to add supplemental electrical circuits including circuit components which require careful electrical and mechanical mounting. It has been the practice to mount these additional components upon conventional terminal blocks having pluralities of terminal connections, using terminal blocks of varying sizes and lengths to most efficiently accommodate the different components. As a result the manufacturer is required to stock many and varied sizes of mounting boards or terminal boards with a consequent loss of time in choosing appropriate mountings and frequent changes of stocked materials.

The present invention is therefore directed to providing a simple and easily installed terminal block capable of accommodating many sizes of components and having the further feature of providing the means for making up composite terminal boards to accommodate any desired number of additional electrical components.

The invention is set forth with particularity in the appended claims. The principles and characteristics of the invention, as well as other objects and advantages are revealed and discussed through the medium of the illustrative embodiments appearing in the specification and drawings which follow.

Figure 2A:
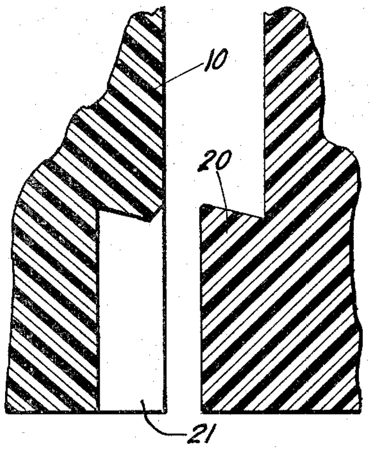
FIGURE 2 is a front elevation view of the terminal block making up the composite terminal board of FIGURE 1.
Figure 2:
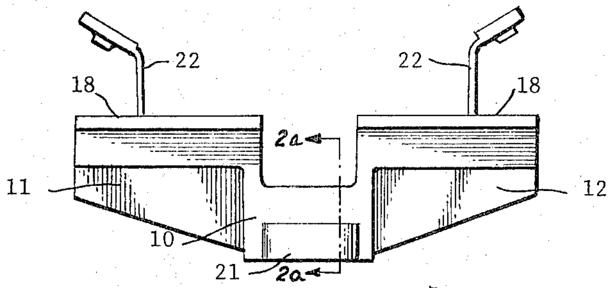

FIGURE 2*a* is a sectional view taken along the lines 2*a*—2*a* of FIGURE 2.

Figure 1:
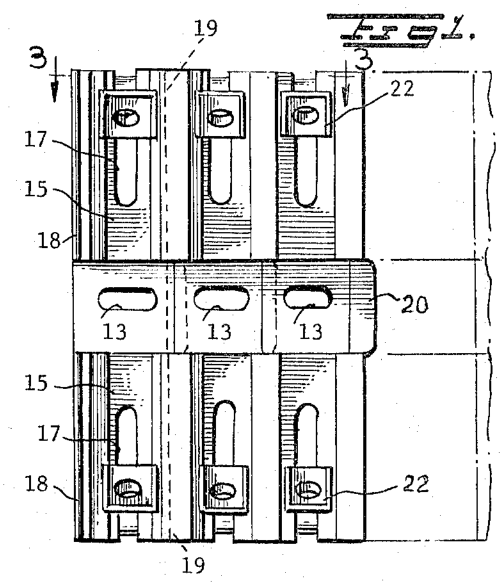
FIGURE 1 is a plan view of a composite terminal board according to the present invention.
Figure 3:
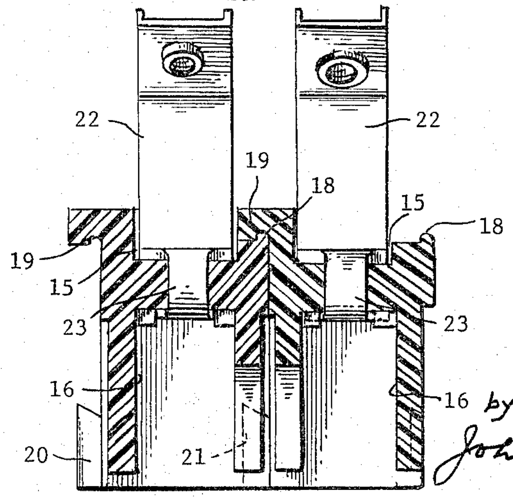

FIGURE 3 is a sectional view taken along the lines 3—3 of FIGURE 1.

Figure 4:
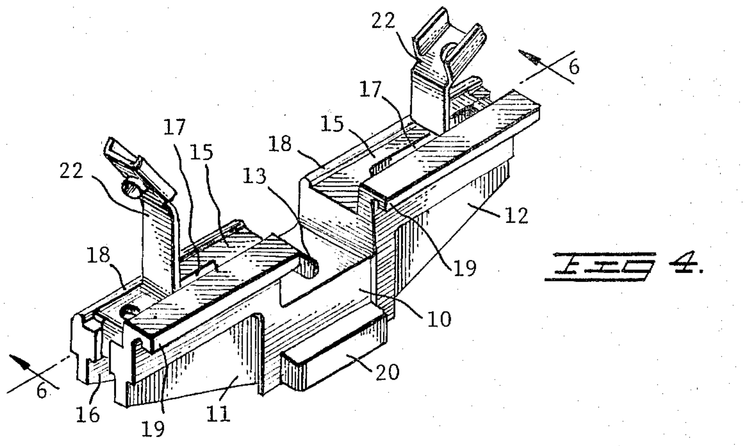

FIGURE 4 is a perspective view of the terminal block of FIGURE 2.

Figure 5:
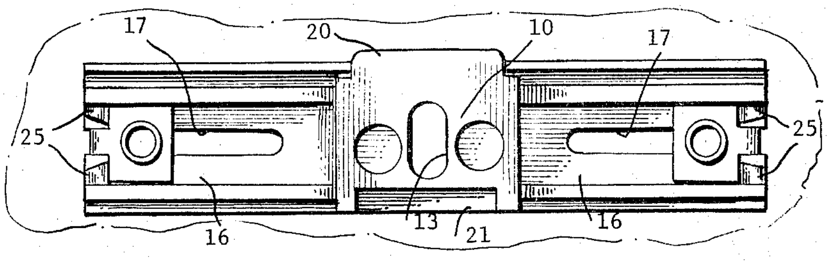

FIGURE 5 is a bottom view of the terminal block of FIGURES 2 and 4.

Figure 6:
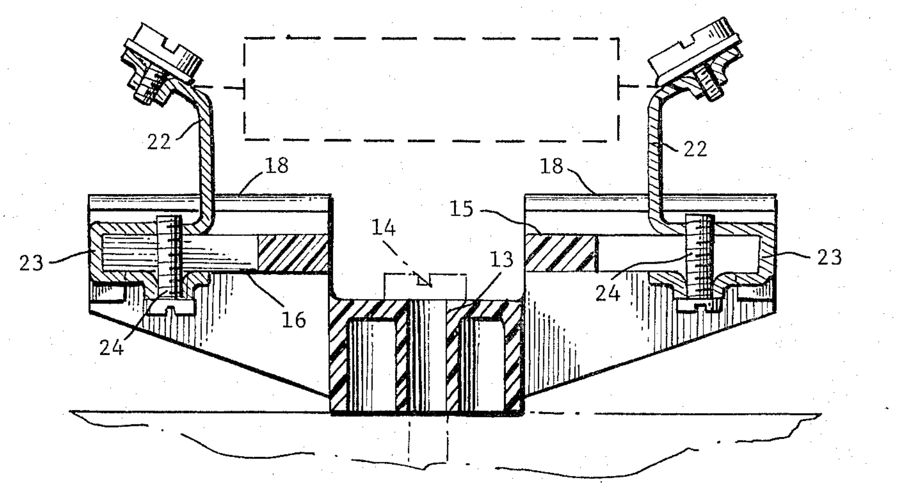

FIGURE 6 is a sectional view taken along the lines 6—6 of FIGURE 4.

The novel terminal block forming the basis of this invention is best illustrated in FIGURES 2 and 4 where an insulating base 10 is provided with extending wings 11 and 12, the entire configuration being formed from a single piece of insulating material, if desired. A mounting hole 13 is formed in the base 10 for mounting the individual blocks (see also FIGURES 1 and 6) via a screw 14, for example, or for mounting the marginal blocks of a composite assembly, as later explained herein.

Referring now specifically to FIGURE 4 each of the wings 11 and 12 is formed with an upper channel 15 and a lower channel 16 and a slotted opening 17 therebetween, these being further illustrated in FIGURES 1, 3 and 5. A raised portion 18 is formed across one top edge of each wing 11 and 12, and the opposite top edges of the wings are formed into a common lip 19. At the bottom edge of the base 10 on the side corresponding to the lip 19 there is an extension 20, its upper surface being inclined outward. On the other side of the base 10 a notched portion 21 is formed having substantially the same dimensions as the extension 20, the upper surface of the notched portion 21 being declined outward (see also FIGURES 2 and 3).

Terminal connectors 22 are provided in the channels 15 (FIGURE 4) extending upward to provide a means for mounting a component as indicated in the dashed lines of FIGURE 6, these connectors being of strap construction and having their upper and lower portions respectively in channels 15 and 16 with a connecting strap 23 (see FIGURES 3, 5 and 6) going through the slotted portion 17 and being clamped in any desired position along the channel-slotted portion path by screws 24 or the like. In other words the connectors 22 may be slidably moved back and forth along the channels 15 (and 16) of the wings so that the distance separating the connectors becomes most suitable for mounting an electrical component. Wiring connections normally are made to the underside of the connectors via the screws 24. On the top side of the channel 16 (see FIGURE 5) at the extremities of the wings there are located projections 25 which engage the lower portion of the connectors 22 to prevent their travel beyond the limits of the wings 11 and 12.

When a single additional component is to be added to an electrical apparatus a single terminal block, as described above, is utilized. However, when several additional components are desired to be added two or more of these blocks may be fastened together as in FIGURE 1. The manner in which this is accomplished is best illustrated by FIGURE 3 wherein the lip 19 of one block is engaged with the raised portion 18 of another block. Similarly the base extension 20 of the first mentioned block is engaged with the notched portion 21 of the second mentioned block, the complementary inclined surfaces of the latter tending to lock the two blocks together. The relationship of these surfaces is clearly illustrated in FIGURE 2*a*, which shows the nature of the mating features respectively of the inclined surfaces 20 and 21. As many blocks as desired may be detachably fixed to each other in this manner to form a composite terminal board, final fastening to the apparatus concerned being made two or more of the mounting holes 13 in the bases of the individual blocks.

While the invention has been explained and described with the aid of particular embodiments thereof, it will be understood that the invention is not limited thereby and that many modifications retaining and utilizing the spirit thereof without departing essentially therefrom will occur to those skilled in the art in applying the invention to specific operating environments and conditions. It is therefore contemplated by the appended claims to cover all such modifications as fall within the scope and spirit of the invention.

What is claimed is:

1. An electrical terminal block comprising an insulating base having a mounting hole, a wing extending from each side of said base, a common raised portion on one top edge of said wings, a notched portion on the corresponding bottom edge of said base, a common lip on the other top edge of said wings, an extension on the corresponding bottom edge of said base having a corresponding recess for engaging with said notched portion, each said wing having a slotted portion running lengthwise therewith, and terminal connectors carried by said slotted portions.

2. A terminal board comprising two or more blocks according to claim 1, the said blocks being detachably fixed to one another by engagement of said raised portion and said notched portion of one said block respectively with said lip and said extension of another said block.

3. An electrical terminal block comprising an insulating base having a mounting hole, a wing extending from each side of said base, a common raised portion on one top edge of said wings, a notched portion on the corresponding bottom edge of said base, the bottom of said notched portion being outwardly inclined, a common lip on the other top edge of said wings, an extension on the corresponding bottom edge of said base, the top of said extension being outwardly inclined, each said wing having a slotted portion running lengthwise therewith, and terminal connectors carried by said slotted portions.

4. A terminal board comprising two or more blocks according to claim 3, the said blocks being detachably fixed to one another by engagement of said raised portion and said notched portion of one said block respectively with said lip and said extension of another said block, the said blocks being hinged together by the junction of said raised portion and said lip and being held togeher by the interlocking action of the inclined planes of the said extension and the said notched portion.

References Cited by the Examiner

UNITED STATES PATENTS

| | | | |
|---|---|---|---|
| 848,505 | 3/1907 | Steinberger | 339—198 |
| 1,530,011 | 3/1925 | Pacent. | |
| 2,553,287 | 5/1951 | Yates | 339—198 X |
| 2,614,471 | 10/1952 | Markowitz. | |
| 2,726,375 | 12/1955 | Gordon | 339—198 |
| 3,167,376 | 1/1965 | Edwards | 339—198 |
| 3,176,256 | 3/1965 | Turnisky | 339—31 |
| 3,212,051 | 10/1965 | Clewes | 339—198 |

EDWARD C. ALLEN, *Primary Examiner.*

ALFRED S. TRASK, *Examiner.*